(12) United States Patent
Ishikawa et al.

(10) Patent No.: US 7,963,029 B2
(45) Date of Patent: Jun. 21, 2011

(54) HOLDING/CONVEY JIG AND HOLDING/CONVEY METHOD

(75) Inventors: Atsushi Ishikawa, Utsunomiya (JP);
Osamu Deguchi, Imaichi (JP);
Katsuyoshi Kameyama, Imaichi (JP);
Makoto Nagaoka, Imaichi (JP); Akihiro Kimura, Imaichi (JP)

(73) Assignee: Daisho Denshi Co., Ltd., Tokyo (JP)

( * ) Notice: Subject to any disclaimer, the term of this patent is extended or adjusted under 35 U.S.C. 154(b) by 843 days.

(21) Appl. No.: 10/532,949

(22) PCT Filed: Jul. 15, 2003

(86) PCT No.: PCT/JP03/08978
§ 371 (c)(1),
(2), (4) Date: Dec. 19, 2005

(87) PCT Pub. No.: WO2004/040953
PCT Pub. Date: May 13, 2004

(65) Prior Publication Data
US 2006/0112543 A1    Jun. 1, 2006

(30) Foreign Application Priority Data

Nov. 1, 2002    (JP) ................ P 2002-319823

(51) Int. Cl.
*H05K 3/36*    (2006.01)
(52) U.S. Cl. ............. 29/830; 29/729; 29/760; 29/831; 269/903
(58) Field of Classification Search ........ 29/830–832, 29/934, 841, 846, 729, 739, 760, 834; 156/89.12, 156/230, 247, 249, 356; 174/255, 259; 269/903; 361/751; 438/108, 714
See application file for complete search history.

(56) References Cited

U.S. PATENT DOCUMENTS

| | | | | |
|---|---|---|---|---|
| 5,352,324 A | * | 10/1994 | Gotoh et al. | 438/714 |
| 5,972,152 A | | 10/1999 | Lake et al. | |
| 6,063,647 A | * | 5/2000 | Chen et al. | 438/108 |
| 6,309,805 B1 | | 10/2001 | Carpenter | |
| 6,458,234 B1 | | 10/2002 | Lake et al. | |

FOREIGN PATENT DOCUMENTS

GB    2030779 A    4/1980
(Continued)

OTHER PUBLICATIONS

Communication from European Patent Office (5 pages) including Supplementary Partial European Search Report under Rule 46(1) EPC dated Jun. 29, 2007 for corresponding Application No. 03809838.0-2214.

(Continued)

*Primary Examiner* — Donghai D. Nguyen
(74) *Attorney, Agent, or Firm* — Holtz, Holtz, Goodman & Chick, PC (57) ABSTRACT

A jig for holding and conveyance includes a plate having a weak-adherence adhesive pattern on a surface and a printed circuit board having a conductive portion and a non-conductive portion on the surface of an insulating substrate. The weak-adherence adhesive pattern is formed at a position corresponding to the non-conductive portion. Alternatively, the weak-adherence adhesive pattern subjected to surface roughening is formed on a surface of the weak-adhesive layer at a position corresponding to the conductive portion.

6 Claims, 7 Drawing Sheets

FOREIGN PATENT DOCUMENTS

| | | | |
|---|---|---|---|
| JP | 63-204696 | A | 8/1988 |
| JP | 1-198094 | A | 8/1989 |
| JP | 01 287989 | A | 11/1989 |
| JP | 02 030196 | A | 1/1990 |
| JP | 04-342196 | | 11/1992 |
| JP | 06-82879 | | 11/1994 |
| JP | 07-099379 | * | 4/1995 |
| JP | 07 297522 | A | 11/1995 |
| JP | 9-18189 | A | 1/1997 |
| JP | 11-79235 | A | 3/1999 |
| JP | 2000-261193 | | 9/2000 |
| JP | 2001-144430 | | 5/2001 |
| JP | 2001-210998 | A | 8/2001 |
| JP | 3435157 | B | 5/2003 |

OTHER PUBLICATIONS

Communication from European Patent Office (5 pages) including Supplementary European Search Report dated Sep. 28, 2007 for corresponding Application No. 03809838.0-2214.

Japanese Patent Office Action (Decision of Rejection) mailed Jul. 22, 2003 in a corresponding Japanese patent application and English translation thereof.

Japanese Patent Office Action (Notice of Reasons for Rejection) mailed Apr. 15, 2003 in a corresponding Japanese patent application and English translation thereof.

Japanese Patent Office Action (Notice of Reasons for Rejection) mailed Sep. 24, 2002 in a corresponding Japanese patent application and English translation thereof.

* cited by examiner

HOLDING/CONVEY JIG AND HOLDING/CONVEY METHOD

This application is a U.S. National Phase Application under 35 USC 371 of International Application PCT/JP03/08978 filed Jul. 15, 2003.

BACKGROUND OF THE INVENTION

1. Field of the Invention

The present invention relates to a jig for holding and conveyance and a holding and conveyance method suitable for a process in which electronic components and the like are mounted on the surface of a printed circuit board in the form of a thin plate such as a flexible printed circuit board, or a process in which the printed circuit board is manufactured.

2. Description of the Related Art

In every kind of electronic appliance from mass-produced appliances such as television sets to appliances for use in rockets or the like of which high reliability is required, printed circuit boards are being presently used for the purpose of improving productivity, ensuring mass production quality, improving reliability, etc. Ordinarily, printed circuit boards are constructed so as to have a conductor pattern on an insulated substrate surface. In recent years, however, flexible printed circuits (hereinafter referred to as "FPC") having a conductor pattern on a surface of a film-like insulated substrate have been provided to meet demands for reducing the size and weight of electronic appliances. For FPCs, a method of mounting electronic components on the conductor pattern surface, i.e., the surface mount method, is being widely used.

The surface mounting method is ordinarily carried out as described below.

A plurality of FPCs are first placed on a surface of a jig for holding and conveyance in the form of a plate, and a heat resistant adhesive tape is adhered to peripheral portions of the FPCs to support the FPCs. Thereafter, cream solder is applied to conductor pattern surfaces on the surfaces of the held FPCs according to the positions at which electronic components are mounted, etc. After mounting the electronic components on the cream solder applied portions, these portions are heated to melt the cream solder, and the molten cream solder is set, thereby connecting the electronic components to the FPCs. Thereafter, the adhesive tape is peeled off the jig, and the FPCs are removed.

In the use of the above-described conventional jig for holding and conveyance, there is a problem in that since there is a need to first peel off the adhesive tape when the FPC is removed from the jig, the number of manufacturing steps is increased. There is also a problem in terms of cost since the adhesive tape is lower in durability and in heat resistance and needs replacement after being used about one time.

As a solution of this problem, a method has been proposed in which a weak-adherence adhesive layer, e.g., a silicone resin layer, is formed on the entire surface of the above-described jig, and FPCs are held by being placed on the surface of the silicone resin layer (e.g., Japanese Unexamined Patent Application, First Publication No. Sho 63-204696). In this case, the heat resistance and the separability of the FPCs from the jig surface are good and realization of low-cost high-efficiency production can therefore be expected. In this case, since the silicone resin layer is uniformly formed on the jig surface, there is a manufacturing problem in that when a metal mask used for application of cream solder to the surfaces of FPCs held on the resin layer surface is separated from the FPC surfaces after application of the cream solder, the metal mask is adhered to portions of the resin layer (between the adjacent FPCs) where the FPCs are not placed, and cannot be suitably separated therefrom.

There is also a problem in that part of the silicone resin layer is dissolved during the cream solder application step or the like, and the dissolved part is transferred onto the FPC surfaces and attached to conductive portions formed on the FPC surfaces to cause failure in connecting electronic components.

In particular, since low-molecular-weight siloxane, which is not formed into a polymer by polymerization, ordinarily remains in the silicone resin, the silicone resin has a characteristic such that the remaining low-molecular-weight siloxane is exposed in the silicone resin layer surface when the silicone resin is heated. Therefore, there is a problem in that, as in the above-described jig arrangement, when a silicone resin layer is uniformly formed on a plate surface and is heated as described above while the entirety of an FPC is placed and held on the silicon resin layer surface, low-molecular-weight siloxane is exposed in the silicone resin layer surface and the exposed part is transferred onto the conductor pattern on the FPC surface. In this case, an electronic component or the like cannot be suitably connected to the portion of the conductor pattern at which the above-described transfer has occurred, and there is a possibility of the occurrence of a connection failure.

SUMMARY OF THE INVENTION

The present invention has been made in consideration of the above-described circumstances, and an object of the present invention is to provide a jig for holding and conveyance and a holding and conveyance method capable of suppressing the occurrence of manufacturing defects in a process in which electronic components or the like are mounted on a surface of a printed circuit board in the form of a thin plate such as a flexible printed circuit board, or a process in which the printed circuit board is manufactured, and also capable of realizing high-efficiency low-cost production.

To achieve the above-described object by solving the above-described problems, the present invention provides means as described below.

According to a first aspect of the present invention, a jig is provided for holding and conveyance comprising: a plate having a weak-adherence adhesive pattern on its surface; and a printed circuit board having a conductive portion and a non-conductive portion on its surface, or a conductive material laminated plate for manufacturing the printed circuit board, the printed circuit board or the conductive material laminated plate being placed and held on the surface of the plate, wherein the weak-adherence adhesive pattern is formed at a position corresponding to the non-conductive portion.

The jig for holding and conveyance in accordance with the present invention is arranged so that the weak-adherence adhesive pattern is formed by being restricted to the portion where the non-conductive portion is placed. This arrangement ensures that when a predetermined step is performed while the printed circuit board or the electroconductive material laminated plate is held on the jig surface, covering of the conductive portion with a diffused part of the weak-adherence adhesive pattern can be suppressed, thereby reducing manufacturing defects in manufacturing steps including the step of connecting electronic components or the like on the surface of the printed circuit board and the step of manufacturing the printed circuit board.

Since the weak-adherence adhesive pattern is in particular formed by being restricted to the non-conductive portion of the printed circuit board surface, it is not formed outside the region where the printed circuit board is placed. Therefore, when a metal mask used for application of cream solder to the surface of the printed circuit board held on the adhesive pattern surface is separated from the printed circuit board surface after application of the cream solder, it is not adhered to the portion of the adhesive pattern where the printed circuit board is not mounted. As a result, the metal mask can be suitably separated from the printed circuit board surface, and the occurrence of manufacturing defects can be limited.

According to a second aspect of the present invention, a jig is provided for holding and conveyance comprising: a plate having a weak-adherence adhesive layer on its surface; and a printed circuit board having a conductive portion and a non-conductive portion on its surface, or a conductive material laminated plate for manufacturing the printed circuit board, the printed circuit board or the conductive material laminated plate being placed and held on the surface of the plate, wherein a weak-adherence adhesive pattern subjected to surface roughening is formed on a surface of the weak-adherence adhesive layer at a position corresponding to the conductive portion.

The jig for holding and conveyance in accordance with the present invention is arranged so that surface roughening is performed by scanning with a laser or the like by being restricted to the portion of the surface of the weak-adherence adhesive layer on which the conductive portion is to be mounted. Accordingly, the portion on which the conductive portion is to be mounted on the surface of the weak-adherence adhesive layer is restrictively reduced in adhesive strength, thereby achieving the same effects and advantages as those achieved by the jig for holding and conveyance in the first aspect.

Preferably, in the jig for holding and conveyance in the first or second aspect, the weak-adherence adhesive pattern has a plurality of thickness regions differing in thickness from the plate surface.

The jig for holding and conveyance in accordance with the present invention is arranged so that the weak-adherence adhesive pattern is changed in thickness from the plate surface in accordance with the thickness regions of the printed circuit board or the electroconductive material laminated plate to be mounted. This arrangement ensures that the printed circuit board or the electroconductive material laminated plate can be stably held on the jig surface, and that working carried out on the printed circuit board or the electroconductive material laminated plate on the jig can be performed with reliability.

Preferably, the weak-adherence adhesive pattern has a plurality of adhesive strength regions differing in adhesive strength.

The jig for holding and conveyance in accordance with the present invention is arranged so that the weak-adherence adhesive pattern has a plurality of adhesive strength regions differing in adhesive strength in accordance with the adhesion regions of the printed circuit board or the electroconductive material laminated plate to be mounted on the jig. Therefore, working to be carried out on the printed circuit board or the like which is held on the jig and removal of the printed circuit board or the like from the jig can be suitably performed without causing any defects.

Preferably, in the jig for holding and conveyance according to the second aspect, a non or less adhesive pattern is formed at a position corresponding to the conductive portion on the surface of the weak-adherence adhesive layer.

The jig for holding and conveyance in accordance with the present invention is arranged so that a non-adhesive pattern, e.g., a pattern of polyimide, a resist for the printed circuit board, aluminum foil or stainless steel foil is formed by being restricted to the portion of the surface of the weak-adherence adhesive layer on which the conductive portion is mounted. Accordingly, the portion of the surface of the weak-adherence adhesive layer on which the conductive portion is mounted is restrictively masked, thereby achieving the same effects and advantages as those achieved by the jig for holding and conveyance in the first aspect.

According to a third aspect of the present invention, a method is provided for conveying a printed circuit board having a conductive portion and a non-conductive portion on its surface while holding the printed circuit board on a jig for holding and conveyance, the jig having a weak-adherence adhesive pattern provided on its surface, wherein when the printed circuit board is held on the surface of the jig for holding and conveyance, the non-conductive portion is placed by being restricted to a surface of the weak-adherence adhesive pattern.

According to the holding and conveyance method in accordance with the present invention, when the printed circuit board is held on the jig surface, only the non-conductive portion is held on the weak-adherence adhesive pattern surface, while the conductive portion is positioned on the portion on which the weak-adherence adhesive pattern is not formed, thereby realizing suitable holding and conveyance such that the occurrence of manufacturing defects can be suppressed.

According to a fourth aspect of the present invention, a method is provided for conveying an electroconductive material laminated plate for manufacturing a printed circuit board having a conductive portion and a non-conductive portion on its surface while holding the electroconductive material laminated plate on a jig for holding and conveyance, the jig having a weak-adherence adhesive pattern provided on its surface, wherein when the electroconductive material laminated plate is held on the surface of the jig for holding and-conveyance, a portion intended for formation of the non-conductive portion is placed by being restricted to a surface of the weak-adherence adhesive pattern.

According to the holding and conveyance method in accordance with the present invention, when the electroconductive material laminated plate is held on the jig surface, only the portion intended for non-conductive portion formation is held on the weak-adherence adhesive pattern surface, while the portion intended for conductive portion formation is positioned on the portion on which the weak-adherence adhesive pattern is not formed, thereby realizing suitable holding and conveyance such that the occurrence of manufacturing defects can be suppressed.

According to a fifth aspect of the present invention, a jig is provided for holding and conveyance comprising: a plate having a weak-adherence adhesive layer on its surface; a printed circuit board having a conductor pattern on its insulating substrate surface, or an electroconductive material laminated plate for manufacturing the printed circuit board, the printed circuit board or the electroconductive material laminated plate being placed and held on the surface of the plate, wherein the weak-adherence adhesive layer is a fluorine-based resin layer.

In the jig for holding and conveyance in accordance with the present invention, the printed circuit board or the electroconductive material laminated plate is held by the fluorine-based resin layer on the jig surface. Therefore, electronic components or the like can be reliably connected to the conductor pattern or the formed conductor pattern surface. That is, the fluorine-based resin layer is free from a remaining low-molecular-weight component which has not been polymerized, and no low-molecular-weight component is exposed on the surface of the fluorine-based resin layer surface even on the step of heating electronic components or the like, i.e., a reflow step, when the electronic components or the like are mounted on the printed circuit board or the like held on the jig. Therefore the low-molecular-weight component is not transferred onto the conductor pattern surface such as the printed circuit board or the like which is held. Also, since the operating environment temperature of the fluorine-based resin layer is comparatively high, in a range from about 250 to 300° C., the fluorine-based resin layer can be reliably adapted for use with lead-free solder (having a reflow temperature in a range from 230 to 280° C.) widely used in environmental measures in recent years.

Preferably, in the jig for holding and conveyance in the fifth aspect, the fluorine-based resin layer is formed so as to hold the printed circuit board or the electroconductive material laminated plate so that a surface of the conductor pattern or an electroconductive material foil surface of the electroconductive material laminated plate is approximately parallel to the plate surface.

The jig for holding and conveyance in accordance with the present invention is arranged to hold each of the plates so that the conductor pattern surface or the conductive material foil surface is approximately parallel to the plate surface, so that an arrangement can be realized in which the conductor pattern or the like on which electronic components or the like are mounted is formed as an outermost layer in the laminated structure including the jig and the printed circuit board or the like held on the jig. This arrangement ensures that working to be carried out on the conductor pattern or the like on the jig can be performed easily and reliably and high-efficiency production can be realized.

Preferably, the fluorine-based resin layer has a plurality of thickness regions differing in thickness from the plate surface.

The jig for holding and conveyance in accordance with the present invention is arranged so that the fluorine-based resin layer is changed in thickness from the plate surface in accordance with thickness regions of the printed circuit board or the electroconductive material laminated plate to be mounted, thereby enabling each plate to be stably held on the jig surface. As a result, working to be carried out on the jig can be performed easily and reliably and high-efficiency production can be realized.

Preferably, the fluorine-based resin layer has a plurality of adhesive strength regions differing in adhesive strength.

The jig for holding and conveyance in accordance with the present invention can be arranged so that the fluorine-based resin layer has a plurality of adhesive strength regions differing in adhesive strength in accordance with the adhesion regions of the printed circuit board or the electroconductive material laminated plate to be mounted on the jig, thereby enabling working to be carried out on the printed circuit board or the like which is held on the jig or removal of the printed circuit board or the like from the jig after working to be suitably performed without causing any defects. That is, the occurrence of a shift in the placement position of the printed circuit board or the like in a direction along the fluorine-based resin layer at the time of working and the occurrence of a defect such as failure to remove the printed circuit board or the like can be reliably suppressed.

Preferably, surface roughening is selectively performed on a region of the fluorine-based resin layer other than the holding portion for holding the printed circuit board or the electroconductive material laminated plate.

In the jig for holding and conveyance in accordance with the present invention, surface roughening is selectively performed (for example, by scanning with a laser or the like) on a region of the fluorine-based resin layer other than the holding portion, thereby realizing an arrangement in which the adhesive strength of the region of the fluorine-based resin layer other than the holding portion is selectively reduced. This arrangement ensures that, for example, when a metal mask used for application of cream solder to the surface of the held printed circuit board is separated from the printed circuit board surface after application of the cream solder, adhesion of the metal mask to a portion on which the printed circuit board is not held can be suppressed. Therefore, the metal mask can be suitably separated from the printed circuit board surface and the occurrence of manufacturing defects can be suppressed. Also, an arrangement can be realized in which the surface of the jig is made generally flat, so that inclination of the metal mask or making the metal mask unstable at the time of application of the cream solder can be suppressed to realize high-efficiency reliable production.

Preferably, a plurality of the fluorine-based resin layers are provided on the plate surface, and a non-adhesive material layer is provided on a non-formation portion of the fluorine-based resin layers on the plate surface.

In the jig for holding and conveyance in accordance with the present invention, a plurality of the fluorine-based resin layers are provided on the plate surface, and a non-adhesive material layer formed of a resist for the printed circuit board, aluminum foil, stainless steel foil, or the like is provided on a non-formation portion of the fluorine-based resin layers on the plate surface, thereby making the jig surface generally flat. As a result, the same effects and advantages as those of the above-described jig for holding and conveyance can be achieved.

Preferably, the fluorine-based resin layer has a holding portion for holding the printed circuit board or the electroconductive material laminated plate, and has a non-adhesive layer on a portion other than the holding portion.

In the jig for holding and conveyance in accordance with the present invention, a non-adhesive layer formed of polyimide, a resist for the printed circuit board, aluminum foil, stainless steel foil, or the like is provided on a portion other than the holding portion on the surface of the fluorine-based resin layer provided on the plate surface, so that almost the entirety of the jig surface is provided as a non-adhesive region in a state where the printed circuit board or the electroconductive material laminated plate is held on the jig surface. Therefore, when, for example, a metal mask used for application of cream solder in the above-described state is separated after application of the cream solder, it can be suitably separated without adhering to the jig and the occurrence of manufacturing defects can be suppressed.

Preferably, the fluorine-based resin layer has a hardness (JIS-A) of 100° or lower.

In the jig for holding and conveyance in accordance with the present invention, since the fluorine-based resin layer is formed at a hardness (JIS-A) of 100° or lower, a jig having an adhesive strength for suitably holding the printed circuit board or the like and good heat resistance can be provided. That is, if the hardness is higher than 100°, the hardness of the fluorine-based resin is excessively high, the affinity to the printed circuit board or the like to be held is reduced, and a gap is formed between the contact surfaces of the printed circuit board or the like and the fluorine-based resin layer which are in contact with each other, resulting in failure to realize adhesion as high as that in the case where the hardness is not higher than 100°. In some cases, if the hardness is higher than 100°, the above-described jig having good adhesion and heat resistance cannot be provided.

The above and other objects and features of the present invention will become more apparent from the following description taken in conjunction with the accompanying drawings.

DETAILED DESCRIPTION OF THE PREFERRED EMBODIMENTS

Embodiments of the present invention will be described with reference to the drawings.

Figure 1:
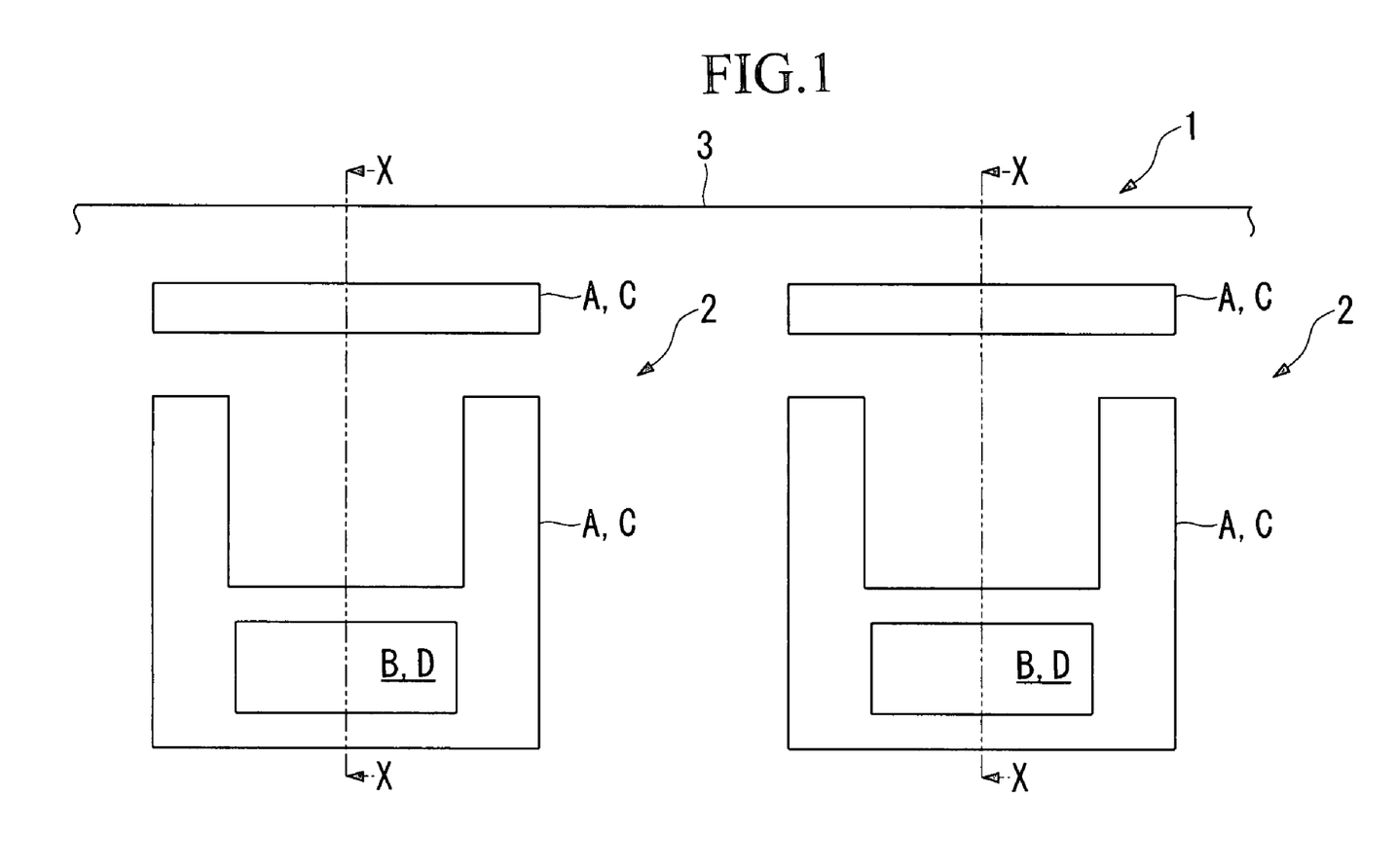
FIG. 1 is a schematic plan view of a jig for holding and conveyance shown as a first embodiment of the present invention.
Figure 2:
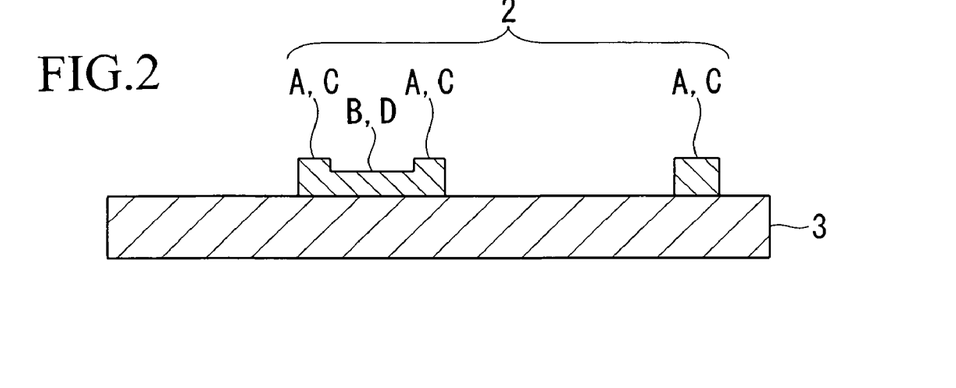
FIG. 2 is a cross-sectional view taken along line X of the jig for holding and conveyance shown in FIG. 1.
Figure 3:
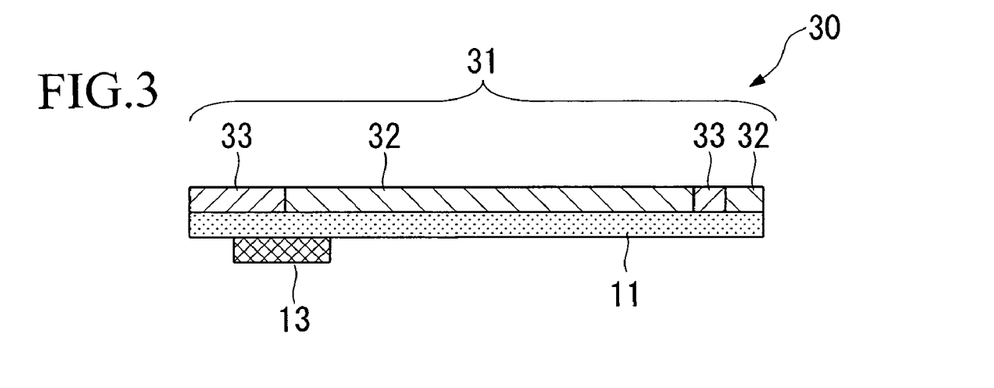
FIG. 3 is a side view of a copper-clad laminated plate held on the surface of the jig for holding and conveyance shown in FIG. 1.
Figure 4:
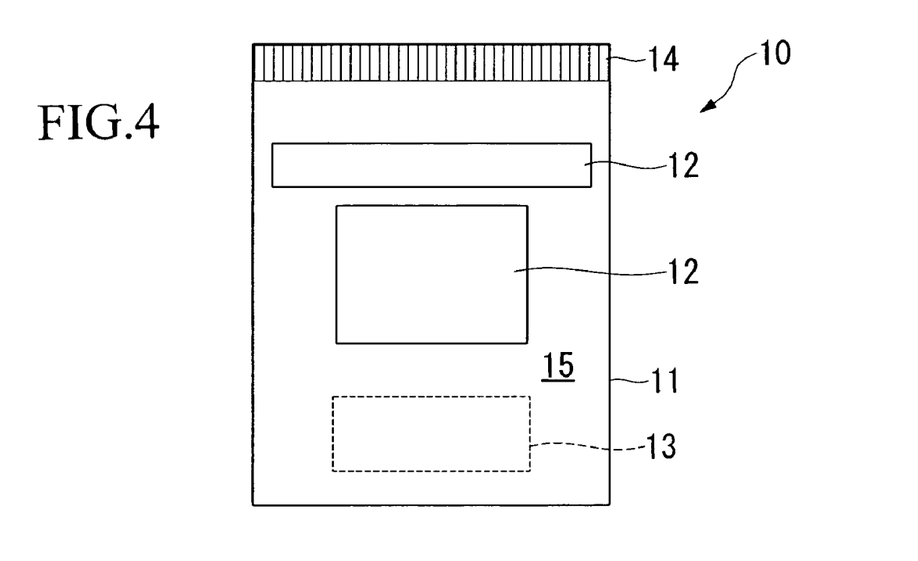
FIG. 4 is a plan view of a printed circuit board formed and held on the surface of the jig for holding and conveyance shown in FIG. 1.
Figure 5:
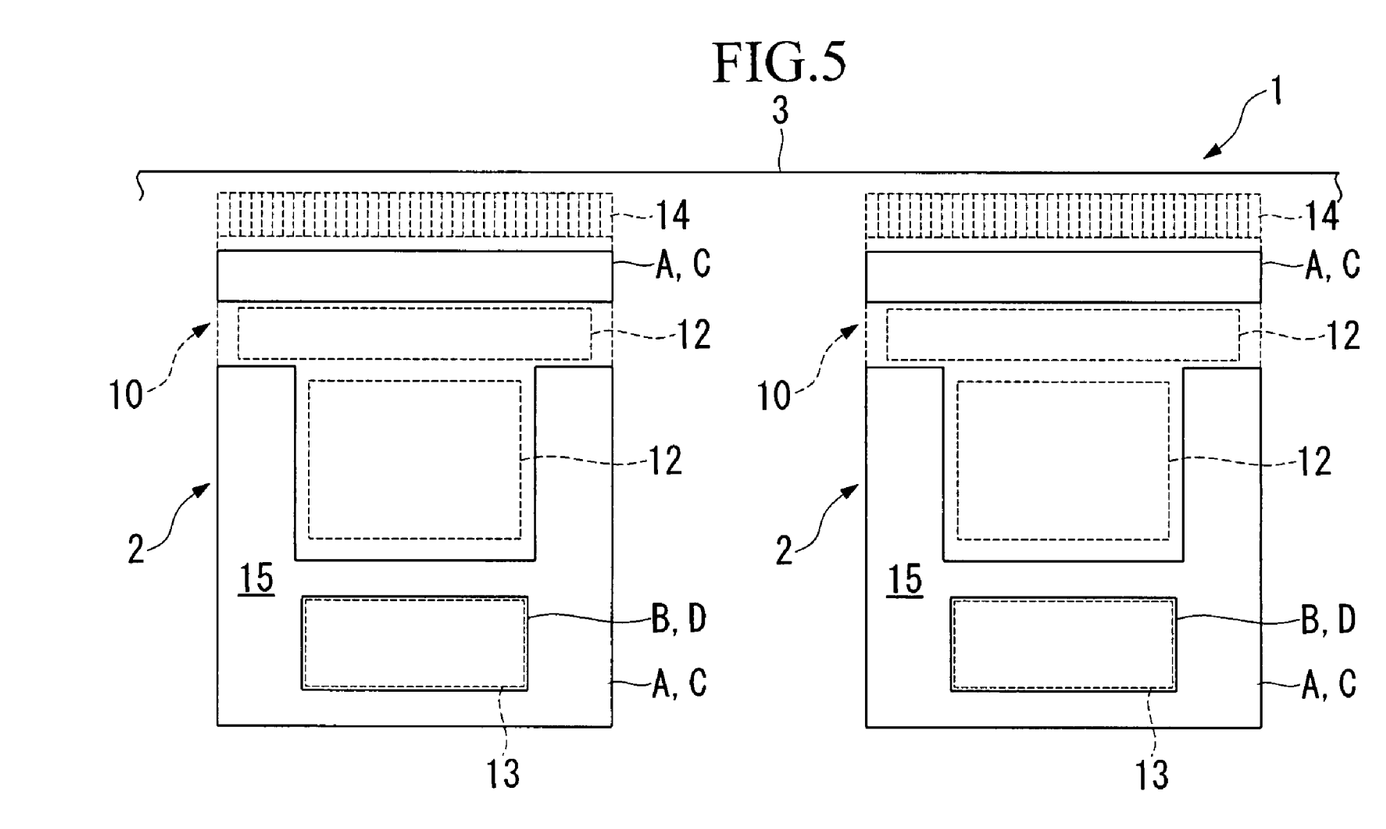
FIG. 5 is a plan view of a state in which the printed circuit board shown in FIG. 4 is held on the surface of the jig for holding and conveyance shown in FIG. 1.

FIGS. 1 to 5 are schematic diagrams showing a jig for holding and conveyance which represents a first embodiment of the present invention. FIG. 1 is a schematic plan view of the jig for holding and conveyance; FIG. 2 is a cross-sectional view taken along line X in FIG. 1; FIG. 3 is a side view of a copper-clad laminated plate for manufacturing a printed circuit board; FIG. 4 is a printed circuit board (flexible printed circuit, hereinafter referred to as "FPC") which is formed and held on a surface of the jig for holding and conveyance shown in FIGS. 1 and 2; and FIG. 5 is a diagram for explaining a positional relationship when the FPC shown in FIG. 4 is formed after holding the copper-clad laminated plate shown in FIG. 3 on the surface of the jig for holding and conveyance shown in FIGS. 1 and 2.

Reference symbol 1 shown in FIG. 1 indicates the jig for holding and conveyance. The jig 1 is constituted by a plate 3 and a plurality of weak-adherence adhesive patterns 2. Each of the plurality of weak-adherence adhesive patterns 2 is formed, for example, from a silicone resin or the like and is formed on a surface of the plate 3. Each weak-adherence adhesive pattern 2 has a plurality of height regions A and B differing in height from that of the plate 3 surface as shown in FIG. 2, and a plurality of adhesive strength regions C and D differing in adhesive strength. Each region A is formed so as to be greater in height than region B. Each region C is formed so as to be higher in adhesive strength than region D.

The copper-clad laminated plate held on the thus-constructed jig 1 for holding and conveyance is formed by a film substrate 11, copper foil 31 adhered to one side of the film substrate 11, and a protrusion 13 formed on the other side of the film substrate 11. The copper foil 31 is formed of portions 32 intended for conductive portion formation and portions 33 intended for non-conductive portion formation described below.

The thus-formed copper-clad laminated plate 30 is placed and held on the jig 1, with the protrusion 13 placed in correspondence with regions B and D formed on the jig 1, and the portions 33 intended for non-conductive portion formation restrictively formed on the surfaces of the weak-adherence adhesive patterns 2 formed on the jig 1. In this state, processing according to a suitable method such as a subtractive method is performed on the surface of the copper foil 31 so that only the copper foil 31 in the portion 32 intended for conductive portion formation remain while the copper foil 31 in the portions 33 intended for non-conductive portion formation are removed, thereby forming the FPC 10 shown in FIG. 4. That is, a conductor pattern 12 and a terminal portion 14 are formed in the portions 32 intended for conductive portion formation. Thus, the FPC 10 having the conductor pattern 12, the terminal portion 14, and the protrusion 13 on the surface of the film substrate 11 is formed (the portion other than the conductor pattern 12, the protrusion 13 and the terminal portion 14 on the surface of the film substrate 11 will be hereinafter referred to as "insulating portion 15").

FIG. 5 shows the positional relationship between FPC 10 and the above-described jig 1 when the FPC 10 is formed on the surface of the jig 1. On the surface of each weak-adherence adhesive pattern 2, only the protrusion 13 and the insulating portion 15, i.e., non-conductive portions, are formed. The conductor pattern 12 and the terminal portion 14, i.e., conductive portions, are formed on the portions where the weak-adherence adhesive pattern 2 is not formed. That is, the weak-adherence adhesive pattern 2 is respectively formed at the positions corresponding to the non-conductive portions 13 and 15 on the plate 3 surface.

The FPC 10 held on the jig 1 surface in the above-described positional relationship is removed from the jig 1 after predetermined steps have been carried out, including the step of applying cream solder to the surfaces of the conductive portions 12 and 14 and the step of connecting electronic components.

As described above, the jig for holding and conveyance according to this embodiment is arranged in such a manner that the weak-adherence adhesive pattern 2 is formed by being restricted to the portions on which the non-conductive portions 13 and 15 are placed. This arrangement ensures that when the step of applying cream solder to the surfaces of the conductive portions 12 and 14 while holding the FPC 10 on the jig 1 surface, the step of forming FPC 10, or a similar step is performed, covering of the conductive portions 12 and 14 by a diffused part of the weak-adherence adhesive pattern 2 is suppressed. Thus, the occurrence of manufacturing defects such as connection failures can be suppressed in the step of connecting electronic components on the FPC 10 surface.

Since the weak-adherence adhesive pattern 2 is formed by being restricted to the positions corresponding to the non-conductive portions 13 and 15 on the FPC 10 surface, it is not formed outside the region where the FPC is placed. Therefore, when a metal mask used for application of cream solder on the surface of the FPC 10 held on the adhesive pattern 2 surface is separated from the FPC 10 surface after application of the cream solder, it is not adhered to the adhesive pattern 2. As a result, the metal mask can be suitably separated from the FPC 10 surface after application of the cream solder to the FPC 10 surface, and the occurrence of manufacturing defects can be suppressed.

Incidentally, the peel strength is preferably 1000 g/cm$^2$ or lower.

Also, the adhesive pattern 2 is provided by being changed in thickness from the plate 3 surface according to the thickness regions (protrusion 13 and the other portion) of the laminated plate surface or the FPC 10 placed on the jig 1, thereby enabling the FPC 10 to be stably held on the jig 1 surface and to be worked with reliability.

Further, the adhesive pattern 2 has a plurality of adhesive strength regions C and D differing in adhesive strength in accordance with the adhesion regions (protrusion 13 and the other portion) of the laminated plate surface or the FPC 10 placed on the jig 1. Therefore, when the laminated plate or the FPC 10 placed on the jig 1 surface is worked and when the laminated plate or the FPC 10 is removed from the jig 1 after working, the working or removing operation can be suitably performed without causing any defects.

Figure 6:
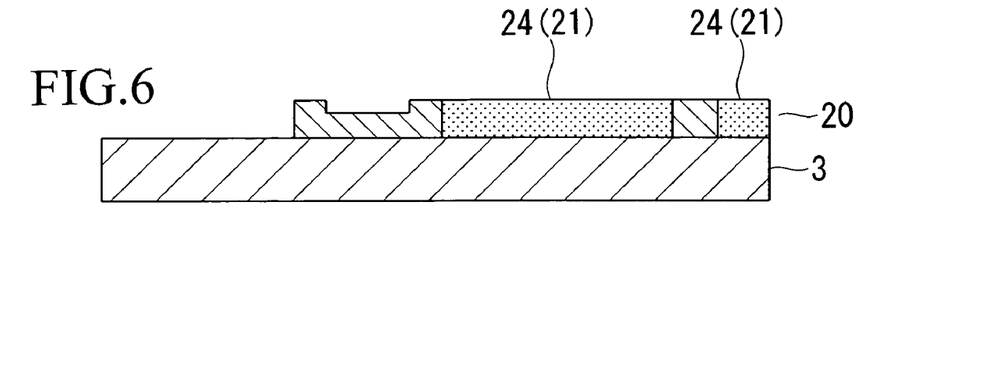
FIG. 6 is a cross-sectional view of a jig for holding and conveyance shown as a second embodiment of the present invention.
Figure 7:
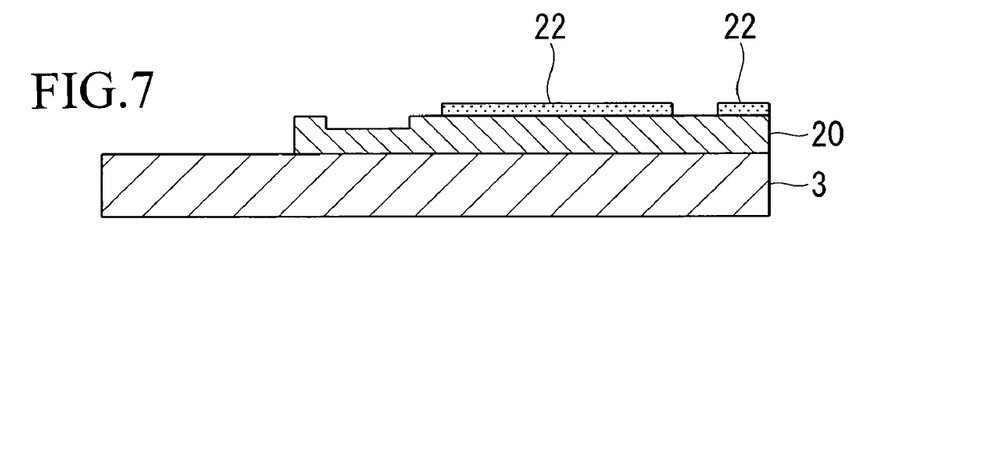
FIG. 7 is a cross-sectional view of a jig for holding and conveyance shown as a third embodiment of the present invention.
Figure 8:
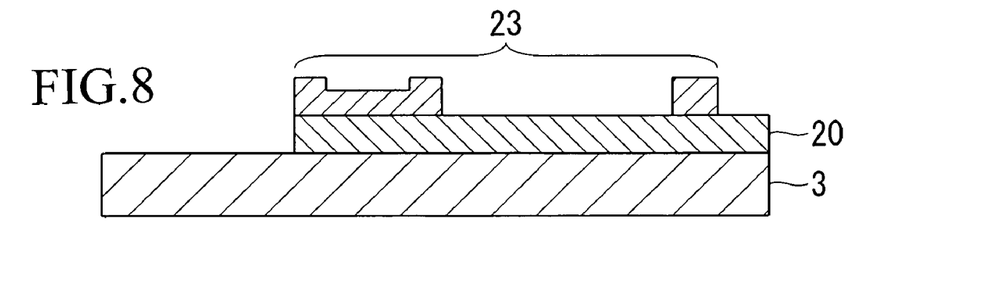
FIG. 8 is a cross-sectional view of a jig for holding and conveyance shown as a fourth embodiment of the present invention.

FIGS. 6 to 8 are diagrams showing other embodiments of the present invention. The embodiments shown in these figures have the same basic configuration as that of the jig 1 shown in FIGS. 1 to 5. In FIGS. 6 to 8, therefore, the same components as those shown in FIGS. 1 to 5 are indicated by the same reference symbols. A description for the same components will not be repeated.

The second embodiment shown in FIG. 6 will first be described. FIG. 6 is a diagram corresponding to the cross-sectional view taken along line X of the jig 1 shown in FIG. 1.

The jig 1 shown in FIG. 6 differs from that of the first embodiment shown in FIGS. 1 to 5 in that surface roughening is performed on the surface of a weak-adherence adhesive layer 20 formed on the plate 3 surface at positions 21 corresponding to the conductive portions 12 and 14 of the FPC 10 shown in FIG. 4 to form a non-adhesive pattern 24. Examples of a method for this surface roughening are a method of scanning the surface with a laser, a method of roughening the surface by sandblasting, and a method of printing a mesh-like pattern of a silicone resin on the surface by screen printing.

By this arrangement, the same effects and advantages as those of the above-described embodiment can be obtained.

The third embodiment shown in FIG. 7 will next be described. FIG. 7 is a diagram corresponding to the cross-sectional view taken along line X of the jig 1 shown in FIG. 1.

The jig 1 shown in FIG. 7 differs from that of the second embodiment shown in FIG. 6 in that a non-adhesive pattern 22 is formed on the surface of the weak-adherence adhesive layer 20 formed on the plate 3 surface at positions corresponding to the conductive portions 12 and 14 of the FPC 10 shown in FIG. 4. Examples of the non-adhesive pattern 22 are patterns of resist ink for a printed circuit board, a cover array polyimide resin, aluminum foil, and stainless steel foil.

By this arrangement, the same effects and advantages as those of the above-described embodiments can be obtained.

The fourth embodiment shown in FIG. 8 will next be described. FIG. 8 is a diagram corresponding to the cross-sectional view taken along line X of the jig 1 shown in FIG. 1.

The jig 1 shown in FIG. 8 differs from that of the second and third embodiments shown in FIGS. 6 and 7 in that a weak-adherence adhesive pattern 23 is formed on the surface of the weak-adherence adhesive layer 20 formed on the plate 3 surface at positions corresponding to the non-conductive portions 13 and 15 of the FPC 10 shown in FIG. 4.

By this arrangement, the same effects and advantages as those of the above-described embodiments can be obtained.

In the above-described embodiments shown in FIGS. 2 and 8, the manufacturing method, e.g., a screen printing method or machining such as backfacing, for forming the weak-adherence adhesive pattern 2 or 23 on the plate 3 surface is not important, and any method may suffice if the weak-adherence adhesive pattern 2 or 23 is formed by being restricted to the positions corresponding to the non-conductive portions 13 and 15.

While in the embodiment shown in FIG. 6 surface roughening is performed on the surface of the weak-adherence adhesive layer 20 formed on the plate 3 surface at positions 21 corresponding to the conductive portions 12 and 14 of the FPC 10 shown in FIG. 4 to form the non-adhesive pattern 24, the same effect as that described above can also be obtained by performing surface roughening at the positions corresponding to the conductive portions 12 and 14 on the FPC 10 to be brought into contact with the jig 1 surface. Also, in the embodiment shown in FIG. 6, surface roughening may be performed in a similar manner between non-adhesive patterns 24. If this surface roughening is performed, when the metal mask used for application of the cream solder to the surface of the FPC 10 held on the jig 1 surface is separated from the FPC 10 surface after application of the cream solder, it can be suitably separated without being adhered to the jig 1 surface.

Figure 9:
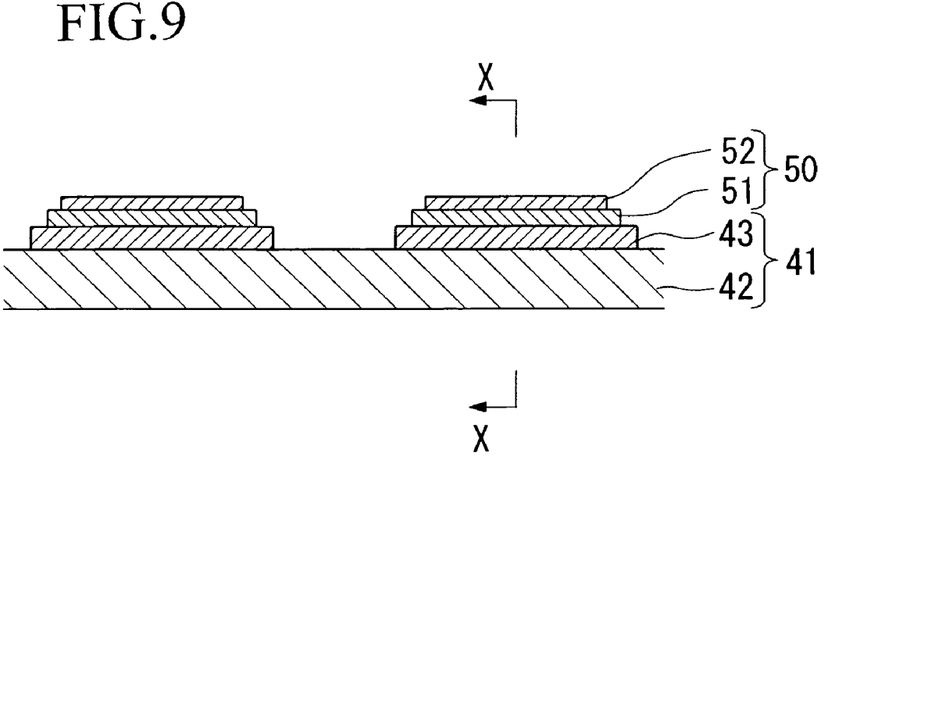
FIG. 9 is a sectional side view of a state in which a printed circuit board is held on the surface of a jig for holding and conveyance shown as a fifth embodiment of the present invention.

A fifth embodiment of the jig for holding and conveyance in accordance with the present invention will be described with reference to FIGS. 9 to 11. Referring to FIG. 9, a jig for holding and conveyance 41 is constituted by a plate 42 containing glass fiber or the like and made of an epoxy resin or the like, and a plurality of fluorine-based resin layers 43. For example, the fluorine-based resin layer 43 is formed of a fluorine-based resin expressed by the following chemical formula (I):

the following chemical formula (II):

or the following chemical formula (III):

and having a characteristic such that no low-molecular-weight component remains when the resin is polymerized. The fluorine-based resin layer 43 is formed at a hardness (JIS-A) within a range from 10 to 100°. If the hardness is within this range, the adhesive strength of the fluorine-based resin layer 43 is within a range from 10 to 2000 g/cm² and the printed circuit board can be suitably held and conveyed. That is, since it is known that the range of adhesive strength in which no manufacturing defect occurs is from 10 to 2000 g/cm², the fluorine-based resin layer 43 formed within the above-described hardness range has suitable adhesive strength.

Figure 10:
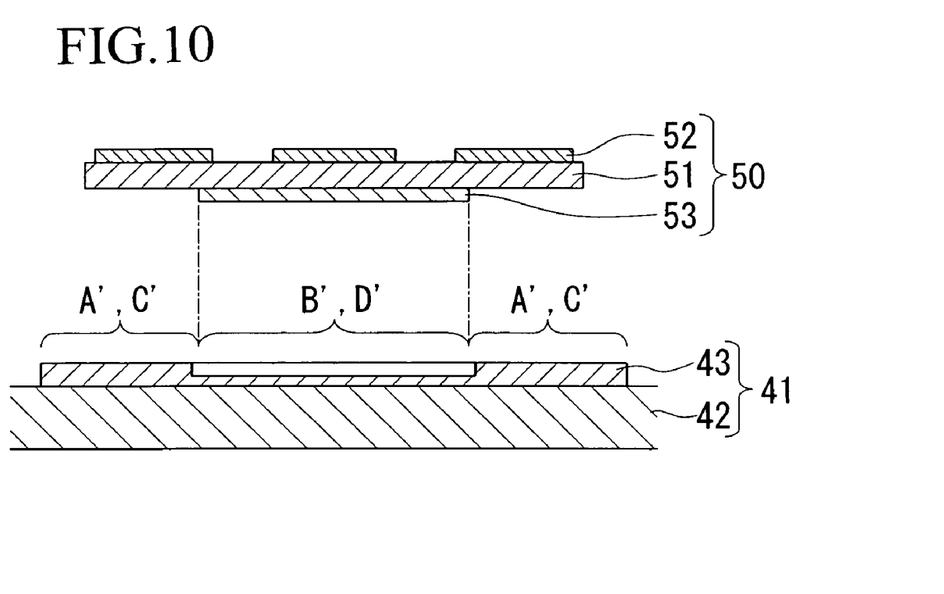
FIG. 10 is an exploded sectional view taken along line X-X of the jig for holding and conveyance and the printed circuit board shown in FIG. 9.
Figure 11:
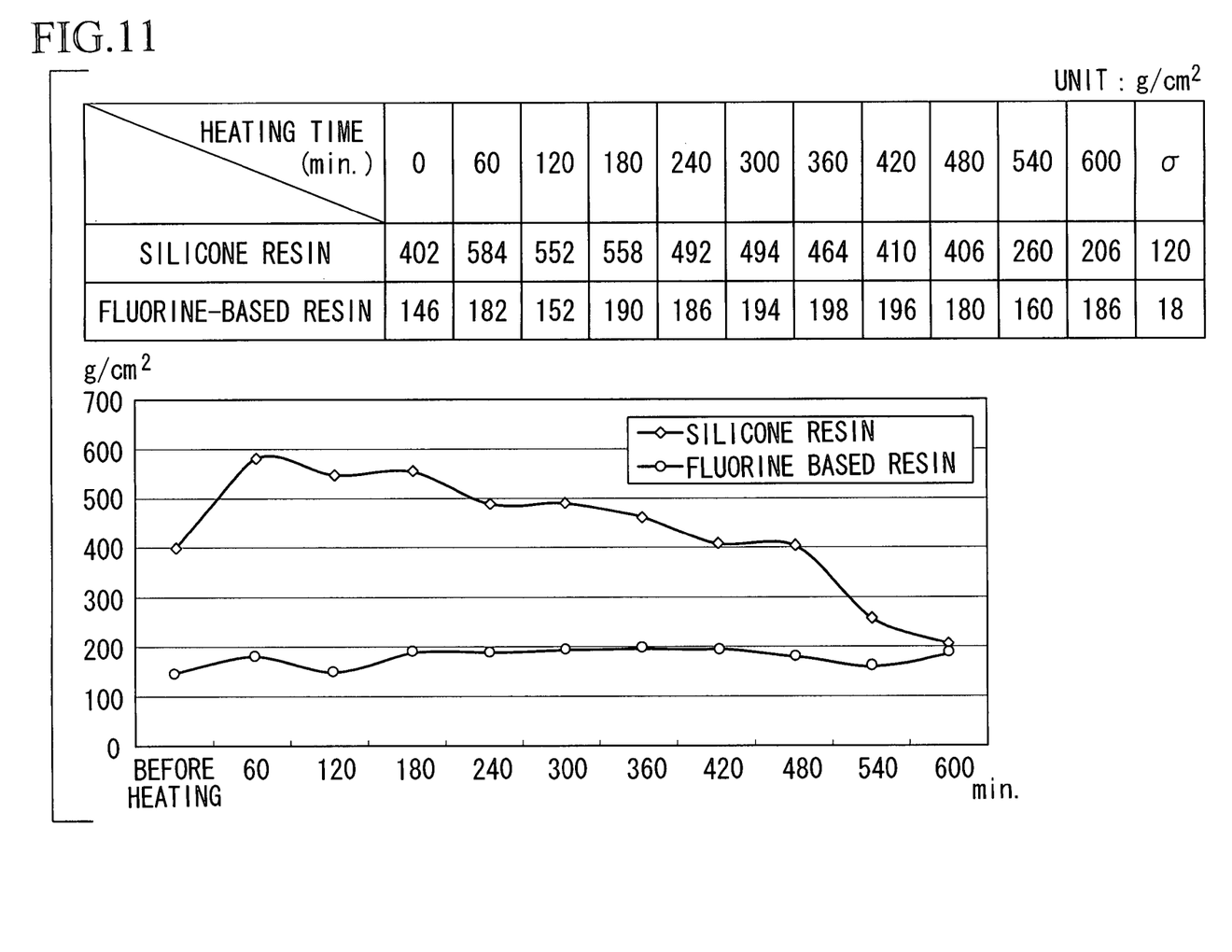
FIG. 11 is a diagram showing the relationship between the adhesion of a fluorine-based resin and a silicone resin and the heating time.

The fluorine-based resin layer 43 has, as shown in FIG. 10, thickness regions A' and B' differing in thickness from the plate 42 surface and adhesive strength regions C' and D' differing in adhesive strength, as in the first embodiment. That is, the thickness region A' is formed so as to be larger in thickness than the thickness region B', and the adhesive strength region C' is formed so as to be higher in adhesive strength than the adhesive strength region D'. In this embodiment, the thickness region A' and the adhesive strength region C' are formed in the same portion, and the thickness region B' and the adhesive strength region D' are formed in the same portion, as are those in the first embodiment.

As shown in FIGS. 9 and 10, a printed circuit board 50 held on the surface of the jig 41 for holding and conveyance formed as described above is formed by an insulating substrate 51, and conductor patterns 52 and 53 formed on the surface of the insulating substrate 51. In the printed circuit board 50 thus formed, as shown in FIG. 10, the conductor pattern 53 formed on one side of the insulating substrate 51 is placed and accommodated in the thickness region B' and the adhesive strength region D' of the fluorine-based resin layer 43 constituting the jig 41, while the conductor pattern 53 non-formation surface on one side is placed by being adhered to the thickness regions A' and the adhesive strength region B'. In this arrangement, the conductor pattern 52 which is formed on the other side of the insulating substrate 51 and on which electronic components or the like are mounted is positioned as an outermost layer. As described above, the printed circuit board 50 is held on the jig 41 surface so that the surfaces of the conductor patterns 52 and 53 are approximately parallel to the plate 42 surface. The planar configuration of each of the plurality of fluorine-based resin layers 43 provided on the plate 42 surface (an external configuration as seen in plan view, the same applies below) is substantially the same as the planar configuration of the printed circuit board 50, so that the extent to which the fluorine-based resin layer 43 projects outwards from the printed circuit board 50 as seen in plan view in a state where a plurality of the printed circuit boards 50 are respectively held on the surfaces of the fluorine-based resin layers 43 is minimized.

The printed circuit board 50 held in the above-described positional relationship on the surface of the jig 41 for holding and conveyance formed as described above is removed from the jig 41 after predetermined steps are carried out including the step of applying cream solder to the surfaces of the conductor patterns 52 and the step of connecting electronic components. Thereafter, the jig 41 is used to hold and convey other printed circuit boards in the same manner without replacement and attachment of fluorine-based resin layers 43, followed by the above-described predetermined steps.

A heat resistance evaluation test was performed from the viewpoint of reduction in adhesive strength of the fluorine-based resin layer 43. For comparison, test pieces having a silicone resin layer in place of the fluorine-based layer 43 were made. Each of the test pieces was placed in an environment having a heating temperature of 300° C. for a predetermined time (0, 60, 120, . . . 600 minutes) and the adhesive strength of the test piece was measured. FIG. 11 shows the results of this test. As shown in FIG. 11, it was confirmed that the adhesive strength in the case of the silicone resin increased before a heating time of 60 minutes had passed because low-molecular-weight siloxane which was not polymerized was exposed in the silicone resin layer surface, and that after a heating time of 60 minutes had passed, the exposed low-molecular-weight siloxane dried and the adhesive strength was gradually reduced. On the other hand, it was confirmed, with respect to the fluorine-based resin layer 43, that the adhesive strength was generally constant irrespective of the heating time because any low-molecular-weight component which was not polymerized was not contained.

In the jig 41 for holding and conveyance according to the fifth embodiment of the present invention, the printed circuit board 50 is held by the fluorine-based resin layer 43 on the jig 41 surface. Therefore, electronic components or the like can be reliably connected to the conductor pattern 52 surface without connection failure. That is, the fluorine-based resin layer 43 is free from a remaining low-molecular-weight component which was not polymerized, and no low-molecular-weight component was exposed on the surface of the fluorine-based resin layer 43 even in the step of heating electronic components or the like, i.e., a reflow step, when the electronic components or the like were mounted on the printed circuit board 50 held on the jig 41. Consequently, it is possible to reliably prevent transfer of the low-molecular-weight component to the conductor pattern 52 surface of the held printed circuit board 50 and to thereby reliably prevent failure in connecting electronic components or the like to the conductor pattern 52 surface.

Since the operating environment temperature of the fluorine-based resin layer 43 is comparatively high, in a range from about 250 to 300° C., the fluorine-based resin layer 43 can be reliably adapted for use with lead-free solder (having a reflow temperature in a range from 230 to 280° C.) widely used in environmental measures in recent years. A method of manufacturing a printed circuit board favorable from an environmental viewpoint can therefore be realized.

Further, since the fluorine-based resin layer 43 is adapted to hold the printed circuit board 50 so that the surfaces of the conductor patterns 52 and 53 are approximately parallel to the plate 42 surface, an arrangement can be realized such that, in the laminated structure formed by the jig 41 and the printed circuit board 50 held on the jig 41, the conductor pattern 52 on which electronic components or the like are mounted can be formed as an outermost layer, thereby enabling working to be carried out on the conductor pattern 52 on the jig 41 to be performed easily and reliably, and realizing high-efficiency production.

Since the fluorine-based resin layer 43 has thickness regions A' and B' differing in thickness from the plate 42 surface in accordance with thickness regions of the printed circuit board 50, i.e., the position at which the conductor pattern 53 is placed, the printed circuit board 50 can be reliably held in a stable state so that the surfaces of the conductor patterns 52 and 53 are approximately parallel to the plate 42 surface, thereby realizing the above-mentioned high-efficiency production with reliability. Further, an arrangement can be realized in which the conductor pattern 53 is accommodated in the thickness region B' of the fluorine-based resin layer 43 to suppress even a shift in the position of the printed circuit board 50 in a direction along the fluorine-based resin layer 43 surface, thereby enabling the above-mentioned high-efficiency production to be realized with further improved reliability.

Since the fluorine-based resin layer 43 has a plurality of adhesive strength regions C' and D' differing in adhesive strength in accordance with the position at which the conductor pattern 53 of the printed circuit board 50 held on the jig 41 surface is placed, the above-mentioned predetermined working on the conductor pattern 52 of the printed circuit board 50 and the removal of the printed circuit board 50 after working can be suitably performed without causing any defects. That is, a shift in the placement position of the printed circuit board 50 in a direction along the fluorine-based resin layer 43 surface when the above-mentioned predetermined working is performed and failure to remove the printed circuit board 50 due to adhesion of the conductor pattern 53 to the thickness region B' of the fluorine-based resin layer 43 at the time of removal of the printed circuit board 50 from the jig 41 can be reduced. That is, in the latter case, since the conductor pattern 53 is accommodated and placed in the thickness region B', the conductor pattern 53 and the thickness region B' easily catch onto each other when the printed circuit board 50 is removed from the jig 41. If in this arrangement the adhesive strength of the thickness region B' and the adhesive strength of the thickness region A' are set equal to each other, a failure to suitably remove the printed circuit board 50 from the jig 41 can occur easily.

Further, since the fluorine-based resin layer 43 is formed at a hardness (JIS-A) within a range from 10 to 100°, an arrangement can be realized in which the adhesive strength within a range from 10 to 2000 g/cm², in which the printed circuit board 50 can be suitably held, can be realized and uniform adhesion through the entire surface can be realized without forming a gap between the contact surfaces of the fluorine-based resin layer 43 and the printed circuit board 50 which are in contact with each other. Also, the fluorine-based resin layer 43 formed within the above-mentioned hardness range is capable of maintaining a generally constant adhesive strength irrespective of the heating time as described above to realize good heat resistance. Therefore, a jig 41 having improved durability can be provided and low-cost production can be realized. Also, production automation can be achieved without causing manufacturing defects. That is, when the printed circuit board 50 is removed from the jig 41 surface after carrying out the predetermined steps for processing on the conductor pattern 52 of the printed circuit board 50, a need arises to change various settings in the manufacturing apparatus with respect to the removal, e.g., the force by which the printed circuit board 50 is held if there is a difference between the initial adhesive strength of the fluorine-based resin layer 43 and the adhesive strength of the fluorine-based resin layer 43 after a certain number of cycles of use. However, the fluorine-based resin layer 43 in which thermal degradation is not easily caused has a stable adhesive strength as described above and is therefore capable of limiting the number of times the settings are changed at the time of removal.

Also, the fluorine-based resin layer 43 is formed in such a manner that the extent to which the fluorine-based resin layer 43 projects outwards from the printed circuit board 50 as seen in plan view in a state where a plurality of the printed circuit boards 50 are respectively held on the surfaces of the fluorine-based resin layers 43 is minimized. Therefore, the metal mask used for application of the cream solder while the printed circuit board 50 is held on the jig 41 surface can be suitably separated after application of the cream solder. That is, the region where the fluorine-based resin layer 43 is placed between the printed circuit boards 50 held on the surface of the jig 41, that is the adhesive region, can be minimized. Therefore, almost the entirely of the contact surfaces of the metal mask and the jig 41 which are in contact with each other can be formed as a non-adhesive region to ensure that the metal mask can be suitably separated without adhering.

A sixth embodiment of the present invention will be described. The same portions as those in the above-described fifth embodiment are indicated by the same reference symbols, and a description for them will not be repeated.

Figure 12:
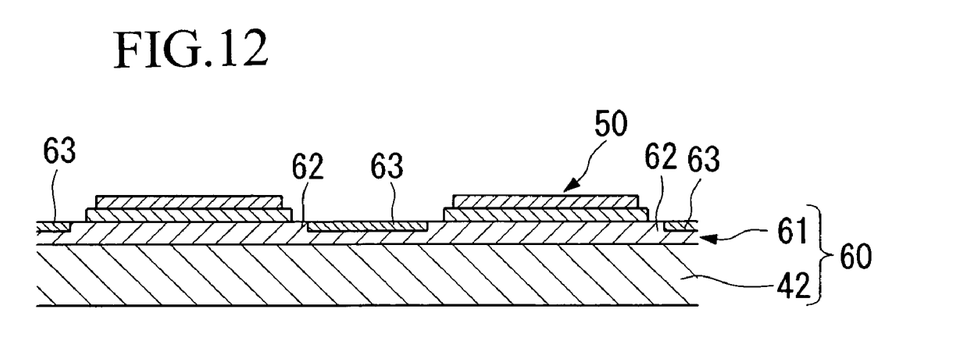
FIG. 12 is a sectional side view of a state in which a printed circuit board is held on a jig for holding and conveyance shown as a sixth embodiment of the present invention.

As shown in FIG. 12, in a jig 60 for holding and conveyance according to the sixth embodiment, surface roughening is selectively performed on regions 63 other than holding portions 62 for holding the printed circuit board 50 in a fluorine-based resin layer 61 provided on the plate 42 surface. This surface roughening is performed, for example, by scanning with a laser.

Since roughening is selectively performed on the regions 63 other than the holding portions 62 in the fluorine-based resin layer 61, the jig 60 for holding and conveyance according to the sixth embodiment can be arranged to restrictively reduce the adhesive strength of the regions 63 other than the holding portions 62 in the fluorine-based resin layer 61. This arrangement ensures that, for example, when the metal mask used for application of cream solder to the surface of the held printed circuit board 50 is separated from the printed circuit board 50 surface after application of the cream solder, adhesion of the metal mask to the portions (the above-mentioned regions 63) on which the printed circuit board 50 is not held can be suppressed. Therefore, the metal mask can be suitably separated from the printed circuit board 50 surface and the occurrence of manufacturing defects can be suppressed. Also, an arrangement can be realized in which the surface of the jig 60 is made generally flat, so that inclination of the metal mask or making the metal mask unstable at the time of application of the cream solder can be limited to realize high-efficiency reliable production.

A seventh embodiment of the present invention will be described. The same portions as those in the above-described fifth and sixth embodiments are indicated by the same reference symbols, and a description for them will not be repeated.

Figure 13:
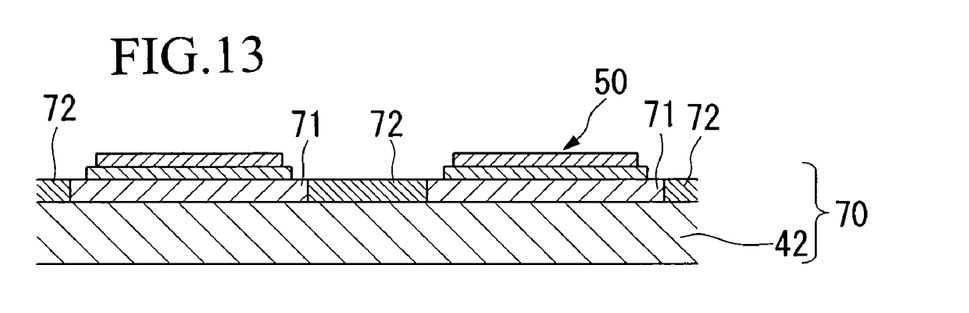
FIG. 13 is a sectional side view of a state in which a printed circuit board is held on a jig for holding and conveyance shown as a seventh embodiment of the present invention.

As shown in FIG. 13, in a jig 70 for holding and conveyance according to the seventh embodiment, a plurality of fluorine-based resin layers 71 are provided on the plate 42 surface, and non-adhesive material layers 72 formed of a resist for forming a printed circuit board, aluminum foil, or stainless steel foil are provided on the non-formation portions of fluorine-based resin layers 71 of the plate 42 surface.

In the jig 70 for holding and conveyance according to the seventh embodiment, since a plurality of fluorine-based resin layers 71 are provided in a plurality of regions on the plate 42 surface, and since non-adhesive material layers 72 are provided on the non-formation portions of the fluorine-based resin layers 71 of the plate 42 surface, the surface of the jig 70 can be made generally flat and the same effect and advantages as those of the above-described jig 60 for holding and conveyance according to the sixth embodiment can be obtained.

An eighth embodiment of the present invention will be described. The same portions as those in the above-described fifth to seventh embodiments are indicated by the same reference symbols, and a description for them will not be repeated.

Figure 14:
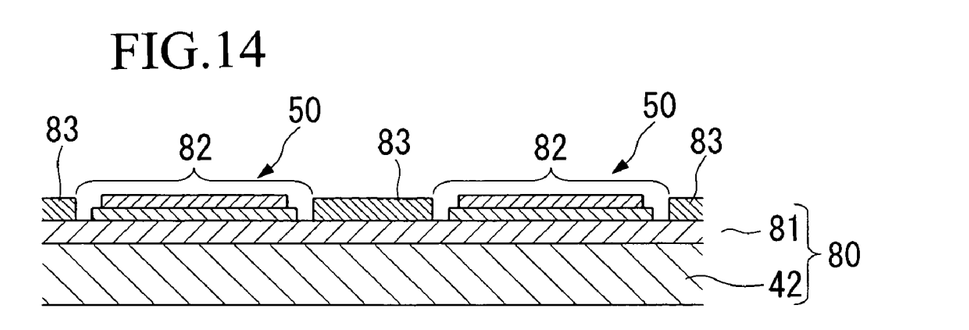
FIG. 14 is a sectional side view of a state in which a printed circuit board is held on a jig for holding and conveyance shown as an eighth embodiment of the present invention.

As shown in FIG. 14, in a jig 80 for holding and conveyance according to the eighth embodiment, a fluorine-based resin layers 81 is provided on the plate 42 surface, and non-adhesive material layers 83 formed of a resist for forming a printed circuit board, aluminum foil, or stainless steel foil are selectively provided on portions of the fluorine-based resin layers 81 other than holding portions 82 for holding printed circuit boards 50. The thickness of the non-adhesive material layers 83 is approximately equal to or smaller than the height from the fluorine-based resin layer 81 surface to the upper end surface of the printed circuit boards 50 in a state where the printed circuit boards 50 are held.

In the jig 80 for holding and conveyance according to the eighth embodiment, since non-adhesive material layers 83 are selectively provided on the portions other than the holding portions 82, an arrangement can be realized in which almost the entirety of the jig 80 surface can be provided as a non-adhesive region in a state where printed circuit boards 50 are held on the jig 80 surface. This arrangement ensures that, for example, when the metal mask used for application of cream solder in the above-described state is separated after application of the cream solder, it can be suitably separated without adhering to the jig 80, and the occurrence of manufacturing defects can be suppressed. Since the thickness of the non-adhesive material layers 83 is approximately equal to or smaller than the height from the fluorine-based resin layer 81 surface to the upper end surface of the printed circuit boards 50 in a state where the printed circuit boards 50 are held, an unstable state of the metal mask, e.g., an inclined state, can be avoided when the metal mask is used in the state where the printed circuit boards 50 are held on the jig 80 surface, thus suppressing the occurrence of manufacturing defects.

The present invention is not limited to the above-described first to eighth embodiments. Various changes may be made without departing from the gist of the present invention. For example, while the fifth to eighth embodiments have been described with respect to an arrangement in which printed circuit boards 50 having conductor patterns 52 and 53 formed on the insulating substrate 51 surface are held, the present invention can be applied to a different arrangement in which electroconductive material laminated plates having an electroconductive material foil such as copper foil adhered to the insulating substrate 51 surface are held and conveyed and, in this state, steps are performed including a step of forming conductor pattern. The present invention can also be applied to holding and conveyance of various electronic components including silicon wafers. Further, while the fifth embodiment has been described with respect to an arrangement in which a plurality of fluorine-based resin layers 43 are provided on the plate 42 surface, an arrangement may be adopted in which one fluorine-based resin is provided on the entire area or part of the plate 42 surface. Further, while the eighth embodiment has been described with respect to an arrangement in which non-adhesive material layers 83 are selectively provided on the portions of the fluorine-based resin layer 81 other than the holding portions 82 for holding printed circuit boards 50, the other portions may be the entire area or part of the fluorine-based resin layer 81 other than the holding portions 82.

Having now fully described the invention, it will be apparent to one of ordinary skill in the art that many changes and modifications can be made thereto without departing from the spirit and scope of the invention as set forth herein.

What is claimed is:

1. A holding and conveyance jig for detachably holding and conveying a printed circuit board on which electronic components are mounted said jig comprising:
   a plate which has a weak-adherence adhesive pattern on a surface of the plate; wherein:
   said printed circuit board has a conductive portion and a non-conductive portion on a surface of the printed circuit board, and said printed circuit board is placed and held on the surface of said plate,
   said weak-adherence adhesive pattern is formed at a position corresponding to said non-conductive portion and detachably holds the printed circuit board at said non-conductive portion, and said weak-adherence adhesive pattern has a plurality of thickness regions differing in thickness from the surface of said plate according to thickness regions of the printed circuit board.

2. The holding and conveyance jig according to claim 1, wherein said weak-adherence adhesive pattern has a plurality of adhesive strength regions differing in adhesive strength.

3. A holding and conveyance jig for detachably holding and conveying a printed circuit board on which electronic components are mounted, said jig comprising:
   a plate which has a weak-adherence adhesive layer on a surface of the plate; wherein:
   said printed circuit board has a conductive portion and a non-conductive portion on a surface of the printed circuit board, and said printed circuit board is placed and held on the surface of said plate,
   a weak-adherence adhesive pattern subjected to surface roughening is formed on a surface of said weak-adherence adhesive layer at a position corresponding to said conductive portion,
   said weak-adherence adhesive layer detachably holds the printed circuit board at said non-conductive portion, and
   said weak-adherence adhesive layer has a plurality of thickness regions differing in thickness from the surface of said plate according to thickness regions of the printed circuit board.

4. The holding and conveyance jig according to claim 3, wherein said weak-adherence adhesive pattern has a plurality of adhesive strength regions differing in adhesive strength.

5. A holding and conveyance jig for detachably holding and conveying a printed circuit board on which electronic components are mounted, said jig comprising:
   a plate which has a weak-adherence adhesive layer on a surface of the plate; wherein:
   said printed circuit board has a conductive portion and a non-conductive portion on a surface of the printed circuit board, and said printed circuit board is placed and held on the surface of said plate,
   a non-adhesive pattern is formed at a position corresponding to said conductive portion on a surface of said weak-adherence adhesive layer,
   said weak-adherence adhesive layer detachably holds the printed circuit board at said non-conductive portion, and
   said weak-adherence adhesive layer has a plurality of thickness regions differing in thickness from the surface of said plate according to thickness regions of the printed circuit board.

6. A method of conveying a printed circuit board comprising the steps of:
   providing on said printed circuit board electronic components which are mounted thereon, said printed circuit board having on a surface thereof a conductive portion and a non-conductive portion, and conveying said printed circuit board while detachably holding said printed circuit board on a surface of a holding and conveyance jig in which a weak-adherence adhesive pattern is provided on the surface of the jig, in a manner such that said non-conductive portion is placed and held by being restricted to a surface of said weak-adherence adhesive pattern, wherein said weak-adherence adhesive pattern has a plurality of thickness regions differing in thickness from a surface of a plate of the jig according to thickness regions of the printed circuit board.

* * * * *